United States Patent [19]

Krämer

[11] Patent Number: 4,777,503
[45] Date of Patent: Oct. 11, 1988

[54] AUDIO-VIDEO ADAPTER FOR AUDIOVISUAL EQUIPMENT

[75] Inventor: Lothar Krämer, Niedereschach, Fed. Rep. of Germany

[73] Assignee: Deutsche Thomson-Brandt GmbH, Villingen-Schwenningen, Fed. Rep. of Germany

[21] Appl. No.: 846,458
[22] PCT Filed: Jun. 25, 1985
[86] PCT No.: PCT/EP85/00306
 § 371 Date: Apr. 8, 1986
 § 102(e) Date: Apr. 8, 1986
[87] PCT Pub. No.: WO86/00771
 PCT Pub. Date: Jan. 30, 1986

[30] Foreign Application Priority Data

Jul. 6, 1984 [DE] Fed. Rep. of Germany ....... 3424931

[51] Int. Cl.$^4$ .............................................. H04N 5/76
[52] U.S. Cl. ..................................... 354/335; 358/181
[58] Field of Search ....................... 358/335, 181, 141; 307/151, 127, 125; 369/15

[56] References Cited

U.S. PATENT DOCUMENTS 4,271,403  6/1981  Severson et al. ................... 358/181

FOREIGN PATENT DOCUMENTS 2932588  2/1981  Fed. Rep. of Germany ...... 358/181
0142684  7/1985  Japan .................................. 358/181

Primary Examiner—Russell E. Adams
Attorney, Agent, or Firm—Max Fogiel

[57] ABSTRACT

Audio-video adapter for connecting two pieces of audiovisual equipment together that are to operate in conjunction in recording and playback but have audiovisual-connection sockets of differing standards, the European Standard (SCART) and the DIN for example. The adapter has a path selector, which controls the direction that the signals travel in. In one of its states the path selector activates a logic circuit that triggers the switchover device, switching through the appropriate signal paths.

8 Claims, 1 Drawing Sheet

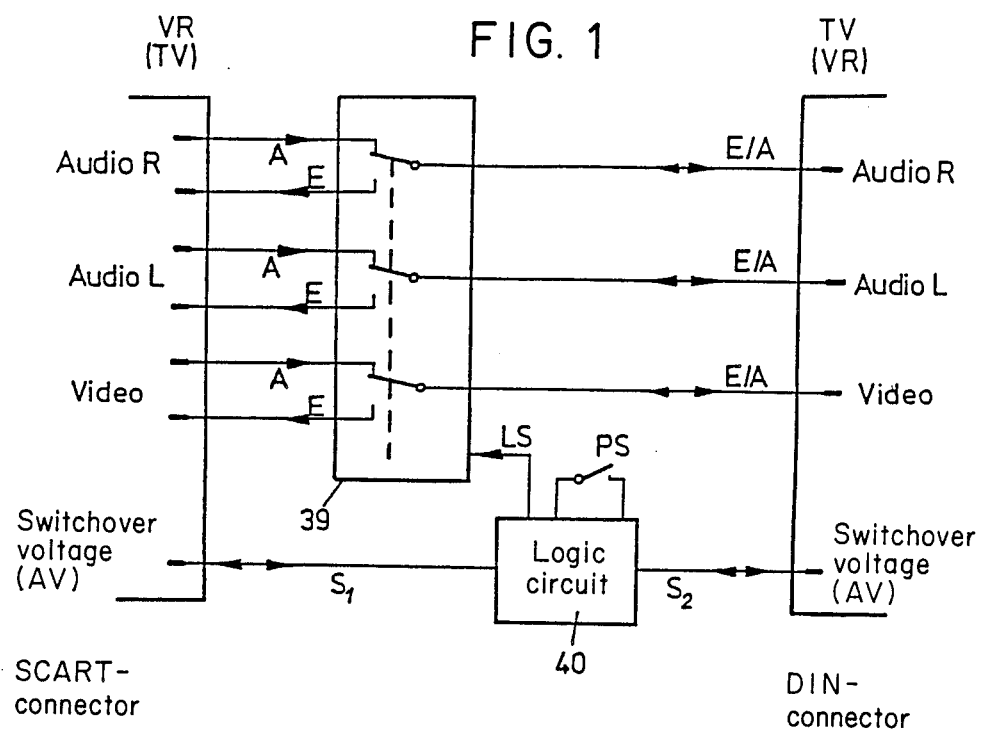

AUDIO-VIDEO ADAPTER FOR AUDIOVISUAL EQUIPMENT

Audiovisual equipment with different types of audiovisual-connection sockets is known from the field of entertainment electronics. Problems occur when pieces of equipment, one having (the older) DIN No. 45 582 connection sockets and another having DIN EN No. 50049 (the European standard) for instance, are to be employed together. Equipment of this type includes videodisk players, mixers, video-production equipment, television sets, monitors, and videorecorders.

Existing connection cables have made it possible to establish connections in only one direction at a time. Specifically, only a Type I cable can be used for example to connect a television set with a DIN socket to a videorecorder with a European Standard (SCART) socket and only a Type II cable to connect a television set with a European Standard socket to a videorecorder with a DIN socket. Since European Standard sockets have separate inputs and outputs for video and audio signals (the latter involving audio-right and audio-left channels), whereas the "older" DIN sockets always has to be switched over in accordance with the signal direction. This switching is carried out by means of a signal-path selector with a relay.

A device of universal application is known from German Pat. No. 3 140 814. The object of that invention is to eliminate the necessity of additional operations like unplugging and replugging connecting lines or manually switching a path selector when pieces of audiovisual equipment having different types of connection sockets are operated in conjunction. The electronics detector circuit described and claimed therein is said to be capable of determining from the presence and type of audio or video signals being supplied which on-line audiovisual equipmet on line is emitting and which is to receive the signals, and of accordingly releasing a switching command to the switchover circuit, which then automatically connects the output lines of the emitting equipment to the input lines of the receiving equipment.

That device, however, cannot be manufactured at a market-worthy price with the means presently available.

The object of the present invention is to provide an audio-video adapter of the type initially described that will allow operations in both directions between two pieces of audiovisual equipment, and especially between two videorecorders when a videotape is being copied, that have connection sockets of different standards. This object is attained in accordance with the invention by claim 1.

Further details are obtained from the dependent claims as well as the description of a preferred embodiment. The invention will hereinafter be described with reference to the drawings.

FIG. 1 is a simplified block diagram of the adapter and

FIG. 2 illustrates one embodiment of the invention by way of example, wherein the selector, the logic circuit, and the switchover device it activates are all accommodated in one housing.

FIG. 1 illustrates, one on the right and one on the left, two pieces of audiovisual equipment, each a videorecorder VR with a television receiver TV, that are to be connected. They have different types of connection sockets, the one on the left a European Standard (SCART) and the one on the right a DIN. The SCART socket has separate input E and output A contacts for audio right, audio left, and video. The DIN socket, however, has joint input-output E/A contacts for audio right, audio left, and video. The arrows indicate the directions that the input and output signals travel in. A logic circuit 40 is positioned between the respective switchover-voltage socket connections. Turning on a path selector PS, which controls the direction that the signals travel in, activates logic circuit 40, which triggers a switchover device 39 through output LS in such a way that all three switches shift from the output to the input contacts. This enables the piece of audiovisual equipment on the right, with the DIN socket, to play through the piece on the left, the videorecorder to play over the television set for example. Logic circuit 40 automatically connects only the particular audiovisual switchover voltage $S_2$ that occurs when a videorecorder is playing back, to the corresponding contact of the other piece of equipment over $S_1$. The voltage is simultaneously exploited to supply logic circuit 40 and switchover device 39.

FIG. 2 illustrates a more detailed embodiment of an adapter. The elements identical to those in FIG. 1 are labeled identically. The SCART and DIN sockets are illustrated with all their contacts numbered. Switchover device 39 is activated by a relay 31 that is triggered by a transistor 37 when path selector PS is in state B. Electronic logic circuit 40 contains diodes 30, 32, 33, 34, and 35 and a resistor 36 for the base bias of transistor 37. Diode 34 is inside the base circuit, and the emitter circuit includes diode 32 when the switch is in state B and diode 35 when it is in state A.

The adapter can be accommodated in a housing 38, indicated by the dot-and-dash lines in FIG. 2, which will enclose logic circuit 40, path selector PS, and switchover device 39 in a practical way.

I claim:

1. An audio-video adapter for connecting together two units of audiovisual equipment that are to operate cooperative in recording and playback modes, and that have audiovisual-connection sockets of differing standards, comprising: a path selector in each unit for controlling direction of signal travel; said path selector having a neutral state and a switchover state; a switchover circuit controlled by said path selector for switching one unit of equipment; separate socket contacts on said one unit of equipment for receiving and transmitting two audio signals and a video signal with respect to the other unit of equipment, said other unit having joint input and output lines in accordance with the equipment's source function or target function; a video recorder with audio-right and audio-left paths and a video path and having a connection socket of any one standard type; a logic circuit connected to said path selector and to said switchover circuit so that said audio-right and audio-left paths and said video path are switched through when said videorecorder with said connection socket is recording and said path selector is in said neutral state; and audiovisual receiver having the other type of connection socket; a switchover voltage occurring at the video recorder; said logic circuit switching on said switchover voltage from said switchover state of the path selector when the videorecorder having one type of connection socket is playing back over said audiovisual receiver having the other type of connection socket; contacts on said audio-right and audio-left paths and said video path, said logic circuit establishing signal direction that both connects the contacts needed for the audio-right and audio-left paths and the video path and forwarding switchover voltage to receiving equipment, said switchover voltage being used thereby to supply said logic circuit and if necessary said switchover circuit.

2. An audio-video adapter as defined in claim 1, including a housing for accommodating circuitry between matching sockets, or between an attached cable and a socket accommodated therein, or has two cables attached with matching jacks at the ends.

3. An audio-video adapter as defined in claim 1, including a housing for accommodating circuitry between an attached cable and a socket.

4. An audio-video adapter as defined in claim 1, including a housing having two cables attached to said housing with matching jacks at ends of said cable.

5. An audio-video adapter for connecting together two units of audiovisual equipment that are to operate cooperative in recording and playback modes, and that have audiovisual-connection sockets of differing standards, comprising: a path selector in each unit for controlling direction of signal travel; said path selector having a neutral state and a switchover state; a switchover circuit controlled by said path selector for switching one unit of equipment; separate socket contacts on said one unit of equipment for receiving and transmitting two audio signals and a video signal with respect to the other unit of equipment, said other unit having joint input and output lines in accordance with the equipment's source function or target function; a video recorder with audio-right and audio-left paths and a video path and having a connection socket of any one standard type; a logic circuit connected to said path selector and to said switchover circuit so that said audio-right and audio-left paths and said video path are switched through when said videorecorder with said connection socket is recording and said path selector is in said neutral state; and audiovisual receiver having the other type of connection socket; a switchover voltage occurring at the video recorder; said logic circuit switching on said switchover voltage from said switchover state of the path selector when the videorecorder having one type of connection socket is playing back over said audiovisual receiver having the other type of connection socket; contacts on said audio-right and audio-left paths and said video path, said logic circuit establishing signal direction that both connects the contacts needed for the audio-right and audio-left paths and the video path and forwarding switchover voltage to receiving equipment, said switchover voltage being used thereby to supply said logic circuit and if necessary said switchover circuit; said path selector comprising a dipole switch having a neutral state for switching the playback from a unit of audiovisual equipment with a DIN connection socket over to a unit of receiving equipment with a European Standard connection socket, said dipole switch having a switchover state for connecting the playback from a unit of audiovisual equipment with a European Standard socket to a unit of receiving equipment with a DIN socket; said logic circuit having a transistor with one diode in a base circuit and another diode in an emitter circuit, said logic circuit activating said switchover circuit when said transistor is switched through in said switchover state.

6. An audio-visual adapter as defined in claim 5, including a housing for accommodating circuitry between matching sockets, or between an attached cable and a socket accommodated therein, or has two cables attached with matching jacks at the ends.

7. An audio-visual adapter as defined in claim 5, including a housing for accommodating circuitry between an attached cable and a socket.

8. An audio-visual adapter as defined in claim 5, including a housing having two cables attached to said housing with matching jacks at ends of said cable.

* * * * *